United States Patent
Otsubo

(10) Patent No.: US 10,271,423 B2
(45) Date of Patent: Apr. 23, 2019

(54) FLEXIBLE SUBSTRATE

(71) Applicant: Murata Manufacturing Co., Ltd., Nagaokakyo-shi, Kyoto-fu (JP)

(72) Inventor: Yoshihito Otsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 85 days.

(21) Appl. No.: 14/747,036

(22) Filed: Jun. 23, 2015

(65) Prior Publication Data
US 2015/0289363 A1    Oct. 8, 2015

Related U.S. Application Data

(63) Continuation of application No. PCT/JP2014/059743, filed on Apr. 2, 2014.

(30) Foreign Application Priority Data

Apr. 19, 2013   (JP) .................................. 2013-088361

(51) Int. Cl.
*H05K 1/02* (2006.01)
*H05K 1/18* (2006.01)
(Continued)

(52) U.S. Cl.
CPC .......... *H05K 1/0271* (2013.01); *H05K 1/028* (2013.01); *H05K 1/0213* (2013.01);
(Continued)

(58) Field of Classification Search
CPC .... H05K 1/028; H05K 1/0278; H05K 3/4691; H05K 1/0271; H05K 1/187–1/189; G02F 1/3452
(Continued)

(56) References Cited

U.S. PATENT DOCUMENTS 4,227,788 A * 10/1980 Shimizu ................. G03B 17/02
396/542
5,008,496 A * 4/1991 Schmidt ............... H05K 1/0278
174/254
(Continued)

FOREIGN PATENT DOCUMENTS

JP         07-283563 A     10/1995
JP         2000-091712 A    3/2000
(Continued)

OTHER PUBLICATIONS

Official Communication issued in International Patent Application No. PCT/JP2014/059743, dated May 20, 2014.

*Primary Examiner* — Tuan T Dinh
(74) *Attorney, Agent, or Firm* — Keating & Bennett, LLP

(57) ABSTRACT

A flexible substrate includes a substrate including interconnection wiring on a surface of or in the substrate, a component disposed on the surface of or in the substrate and electrically connected to the interconnection wiring, and an external connection conductor provided on the surface of the substrate. The substrate includes, when viewed two-dimensionally, a base portion where the external connection conductor is disposed, and a projecting portion projecting from the base portion. The projecting portion includes a first constricted portion provided at a connection to the base portion, and a first wide portion provided on an extension of the first constricted portion and having a width greater than that of the first constricted portion, with the component being disposed in the first wide portion.

19 Claims, 11 Drawing Sheets

(51) Int. Cl.
*H05K 1/03* (2006.01)
*H05K 1/11* (2006.01)

(52) U.S. Cl.
CPC ......... *H05K 1/0298* (2013.01); *H05K 1/0393* (2013.01); *H05K 1/181* (2013.01); *H05K 1/182* (2013.01); *H05K 1/189* (2013.01); *H05K 1/118* (2013.01); *H05K 2201/05* (2013.01); *H05K 2201/052* (2013.01); *H05K 2201/09063* (2013.01); *H05K 2201/09972* (2013.01)

(58) Field of Classification Search
USPC ................. 174/254–262; 361/749–750, 763, 361/775–778
See application file for complete search history.

(56) References Cited

U.S. PATENT DOCUMENTS

| | | | | |
|---|---|---|---|---|
| 5,121,297 | A * | 6/1992 | Haas | H05K 3/4691 |
| | | | | 174/254 |
| 5,404,239 | A * | 4/1995 | Hirai | G02F 1/13452 |
| | | | | 174/254 |
| 7,292,448 | B2 * | 11/2007 | Urushibara | H05K 1/189 |
| | | | | 156/252 |
| 7,551,449 | B2 * | 6/2009 | Yasui | H05K 1/189 |
| | | | | 257/686 |
| 7,881,064 | B2 * | 2/2011 | Cole | H05K 1/0271 |
| | | | | 174/254 |
| 2002/0050399 | A1 * | 5/2002 | Yang | H05K 1/028 |
| | | | | 174/250 |
| 2002/0131253 | A1 * | 9/2002 | Kobayashi | H05K 1/0271 |
| | | | | 361/760 |
| 2004/0118595 | A1 * | 6/2004 | Flammer | H05K 1/0278 |
| | | | | 174/254 |

FOREIGN PATENT DOCUMENTS

| | | |
|---|---|---|
| JP | 2004-029651 A | 1/2004 |
| JP | 2005-317795 A | 11/2005 |
| JP | 2006-269832 A | 10/2006 |
| JP | 2008-226932 A | 9/2008 |
| JP | 2010-192749 A | 9/2010 |
| JP | 2012-195468 A | 10/2012 |

* cited by examiner

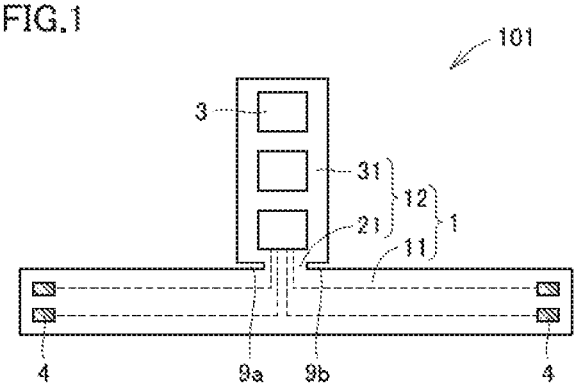
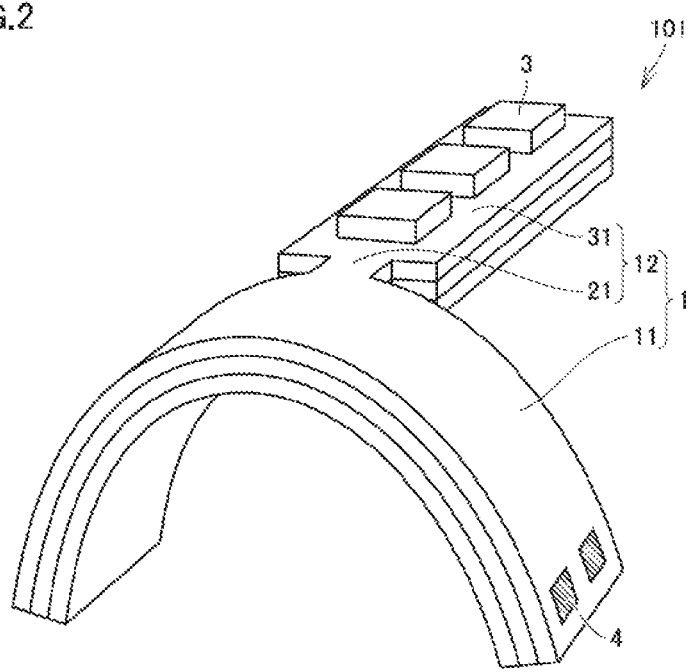

FLEXIBLE SUBSTRATE

BACKGROUND OF THE INVENTION

1. Field of the Invention

The present invention relates to flexible substrates.

2. Description of the Related Art

Japanese Patent Laying-Open No. 2012-195468 describes an example of a multilayer substrate based on conventional techniques. Such a multilayer substrate which is flexible as a whole is referred to as a flexible substrate. A flexible substrate is generally used in a bent state, or used under conditions where the flexible substrate is repeatedly bent.

When a flexible substrate including components is bent and connected to another member, bending stress occurs in the included components as well as at a connection between the components and a conductor pattern in a laminate. When such bending stress increases and rises above a certain level, a portion responsible for electrical connection may be ruptured, for example, resulting in degradation of reliability of connection between the components and the conductor pattern in the laminate.

SUMMARY OF THE INVENTION

Accordingly, preferred embodiments of the present invention significantly reduce or prevent degradation of reliability of electrical connection due to bending of a flexible substrate to mount the substrate to another member.

A flexible substrate according to a preferred embodiment of the present invention includes a substrate including interconnection wiring on a surface of or in the substrate, a component disposed on the surface of or in the substrate and electrically connected to the interconnection wiring, and an external connection conductor provided on the surface of the substrate, the substrate including, when viewed two-dimensionally, a base portion where the external connection conductor is disposed, and a projecting portion projecting from the base portion, the projecting portion including a first constricted portion provided at a connection to the base portion, and a first wide portion provided on an extension of the first constricted portion and having a width greater than that of the first constricted portion, with the component being disposed in the first wide portion.

According to a preferred embodiment of the present invention, even when the base portion is bent, bending transmitted to the first wide portion is limited to a small amount of bending transmitted via the first constricted portion, thus preventing high bending stress in the component disposed in the first wide portion and at an electrical connection to the component. Thus, degradation of reliability of electrical connection due to the bending of the flexible substrate to mount the substrate to another member is significantly reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a plan view of a flexible substrate according to a first preferred embodiment of the present invention.

FIG. 2 is a perspective view of a state in which the flexible substrate according to the first preferred embodiment of the present invention has been bent.

DETAILED DESCRIPTION OF THE PREFERRED EMBODIMENTS

First Preferred Embodiment

Figure 3:
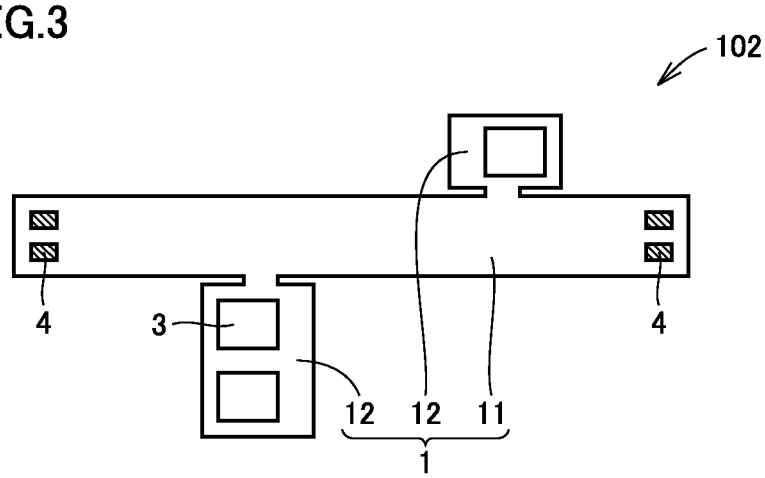
FIG. 3 is a plan view of a first variation of the flexible substrate according to the first preferred embodiment of the present invention.

Referring to FIGS. 1 and 2, a flexible substrate according to a first preferred embodiment of the present invention is described. FIG. 1 shows a plan view of the flexible substrate in this preferred embodiment.

A flexible substrate 101 in this preferred embodiment includes a substrate 1 including interconnection wiring (shown as dotted lines) on a surface of or in substrate 1, components 3 disposed on the surface of or in substrate 1 and electrically connected to the interconnection wiring, and external connection conductors 4 provided on the surface of substrate 1. Substrate 1 includes, when viewed two-dimensionally, a base portion 11 where external connection conductors 4 are disposed, and a projecting portion 12 projecting from base portion 11. Projecting portion 12 includes a first constricted portion 21 provided at a connection to base portion 11, and a first wide portion 31 provided on an extension of first constricted portion 21 and having a width greater than that of first constricted portion 21. Components 3 are disposed in first wide portion 31.

Substrate 1 may be, without limitation, a resin multilayer substrate, or may be another type of substrate as long as it is a flexible substrate. Substrate 1 may be a single-layer substrate instead of a multilayer substrate. If substrate is a resin multilayer substrate, this resin multilayer substrate may be formed of, for example, laminated, thermocompression-bonded thermoplastic resin layers.

In this preferred embodiment, first constricted portion 21 is preferably formed by making cutouts 9a and 9b from both right and left sides at the bottom of projecting portion 12, as shown in FIG. 1.

FIG. 2 shows an example of a state in which base portion 11 has been bent in flexible substrate 101 in order to connect external connection conductors 4 to other members.

In this preferred embodiment, since projecting portion projecting from base portion 11 includes first constricted portion 21 and first wide portion 31 provided on an extension of first constricted portion 21, even when base portion 11 is bent, bending transmitted to first wide portion 31 is limited to a small amount of bending transmitted via first constricted portion 21. In addition, since components 3 are disposed in first wide portion 31, the bending is less likely to be transmitted to components 3, thus avoiding the occurrence of high bending stress in components 3 and at electrical connections to components 3. Thus, degradation of reliability of electrical connection due to the bending of flexible substrate 101 to mount of the substrate to another member is significantly reduced or prevented.

Significantly reducing or preventing the degradation of reliability of electrical connection due to the bending in various preferred embodiments of the present invention is cost effective as it eliminates the need to increase the number of laminated resin layers in order to harden a component mounting portion of the substrate, or the need to replace the type of resin included in the resin layers with a harder one, as would be needed in conventional techniques. When various preferred embodiments of the present invention are applied, less attention is required to ensure that the electrical connection is maintained at the time of bending of the flexible substrate. This allows for more freedom in bending in order to connect the flexible substrate to another member, thus attaining a higher degree of freedom of posture during the connection.

If the substrate is a resin substrate, the thickness of a component mounting portion of the substrate is conventionally increased in order to harden the component mounting portion. Consequently, a bottom surface where the components are mounted tends to bulge, and the bulge may result in failed mounting. According to various preferred embodiments of the present invention, however, there is no need to harden the component mounting portion of the substrate, thus reducing the thickness of the component mounting portion, and there is no bulge of the bottom surface, thus preventing failed mounting caused by the bulge.

When the degradation of reliability of electrical connection due to the bending is significantly reduced or prevented by various preferred embodiments of the present invention, the thickness of the component mounting portion of the substrate is able to be reduced, leading to improvement in heat dissipation capability.

Variations

Although substrate 1 is illustrated and described above as including only one projecting portion 12, with all of components 3 being disposed together in this one projecting portion 12 in the example shown in FIGS. 1 and 2, this is merely an example. Substrate 1 may include a plurality of projecting portions 12.

A variation of this preferred embodiment may be, for example, a flexible substrate 102 such as shown in FIG. 3. Flexible substrate 102 is provided with a plurality of projecting portions 12, with components 3 being dispersed over the plurality of projecting portions 12. By using this configuration, the length of lateral projection from base portion 11 is significantly reduced, thus significantly reducing the overall width of flexible substrate 102.

It is noted that projecting portions 12 do not necessarily project to the same side from the base portion, but may be project from either side. In flexible substrate 102, as shown in FIG. 3, projecting portions 12 exist both on the upper side and the lower side of the figure with respect to base portion 11.

Figure 4:
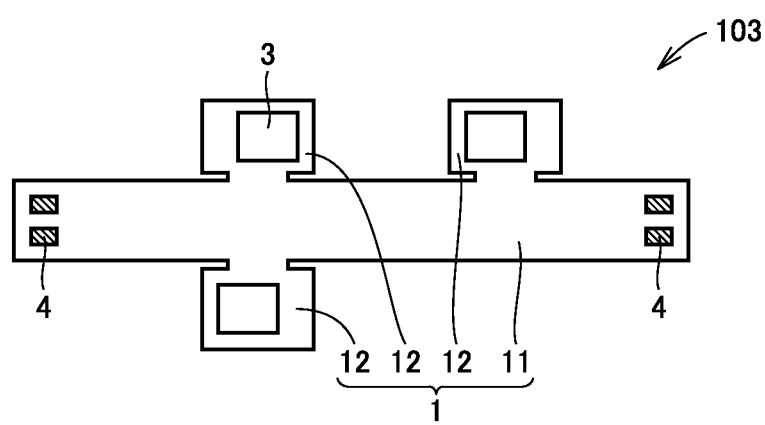
FIG. 4 is a plan view of a second variation of the flexible substrate according to the first preferred embodiment of the present invention.

A variation of this preferred embodiment may be a flexible substrate 103 such as shown in FIG. 4. In flexible substrate 103, one projecting portion 12 is provided for each component. By using this configuration, the length of lateral projection from base portion 11 is able to be further reduced, thus reducing the overall width of flexible substrate 103.

Figure 5:
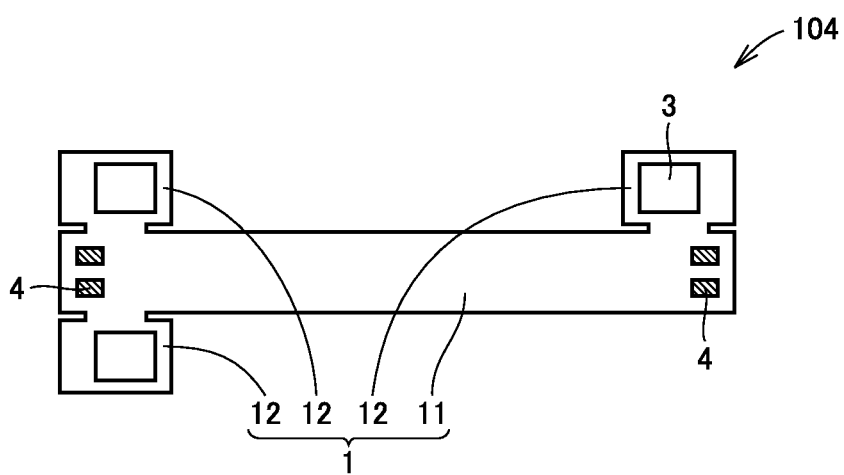
FIG. 5 is a plan view of a third variation of the flexible substrate according to the first preferred embodiment of the present invention.

Furthermore, a variation of this preferred embodiment may be a flexible substrate 104 such as shown in FIG. 5. Projecting portions 12 do not necessarily project laterally from a middle portion of base portion 11, but may project laterally from an end portion of base portion 11, as with projecting portions 12 of flexible substrate 104.

Figure 6:
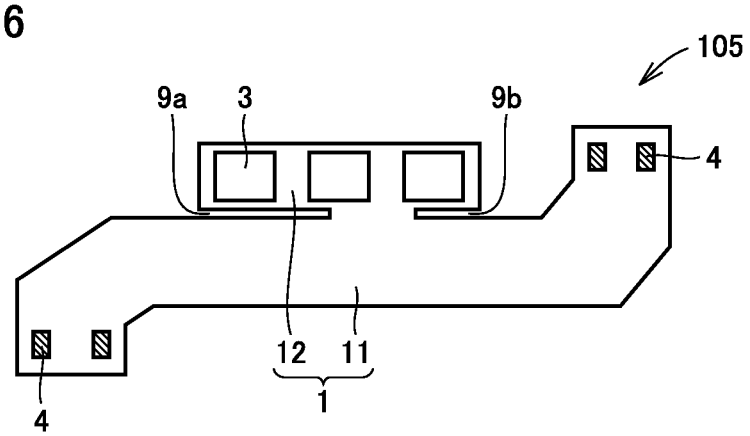
FIG. 6 is a plan view of a fourth variation of the flexible substrate according to the first preferred embodiment of the present invention.

Although this preferred embodiment has been described by referring to base portion 11 having a strip shape by way of example, base portion 11 does not necessarily have a strip shape but may have any shape as long as being bendable depending on the intended purpose of use. Thus, a variation of this preferred embodiment may be, for example, a flexible substrate 105 such as shown in FIG. 6. In flexible substrate 105, base portion 11 has a shape including bent portions. In flexible substrate 105, projecting portion 12 has a longitudinal shape extending parallel or substantially parallel to a longitudinal direction of base portion 11. In projecting portion 12 of flexible substrate 105, a constricted portion is preferably formed by making cutouts 9a and 9b from both sides in a direction parallel or substantially parallel to a longitudinal direction of projecting portion 12.

Second Preferred Embodiment

Figure 7:
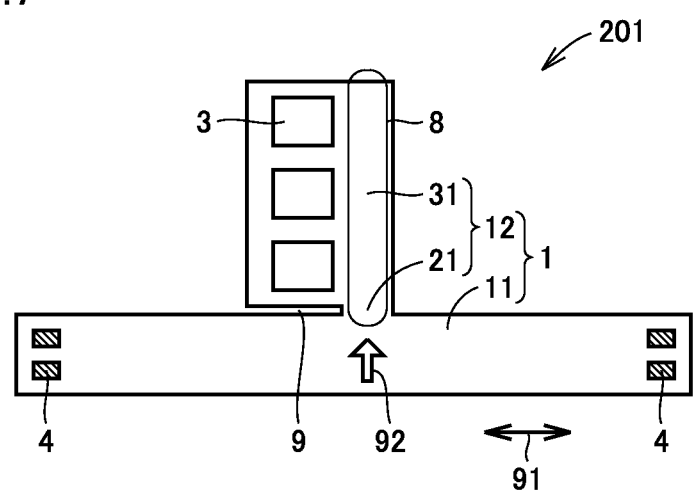
FIG. 7 is a plan view of a flexible substrate according to a second preferred embodiment of the present invention.
Figure 8:
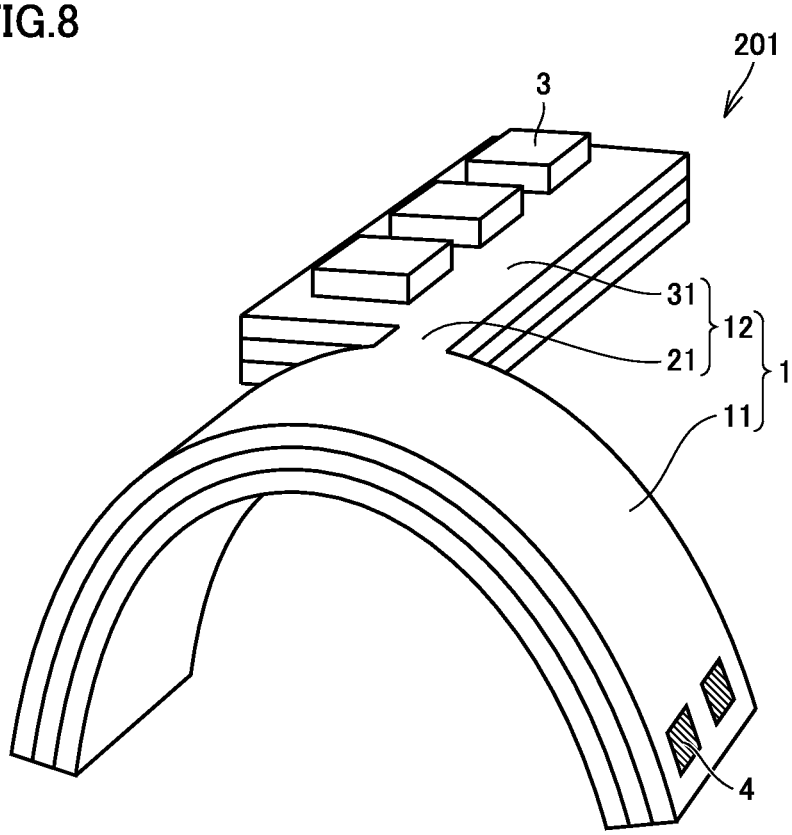
FIG. 8 is a perspective view of a state in which the flexible substrate according to the second preferred embodiment of the present invention has been bent.

Referring to FIGS. 7 and 8, a flexible substrate according to a second preferred embodiment of the present invention is described. FIG. 7 shows a plan view of the flexible substrate in this preferred embodiment.

A flexible substrate 201 in this preferred embodiment has a basic configuration, which preferably is the same or substantially the same as that of flexible substrate 101 described in the first preferred embodiment, but is different in the following point. That is, in flexible substrate 201, components 3 are disposed in a portion except for a region 8 through which bending is transmitted into projecting portion 12 via first constricted portion 21 when base portion 11 is bent in order to establish connection to another member by external connection conductors 4. In this preferred embodiment, first constricted portion 21 is preferably formed by making a cutout 9 from one side at the bottom of projecting portion 12.

This preferred embodiment is based on the assumption that base portion 11 has a linear strip shape, and that base portion 11 is simply bent in order to connect external connection conductors 4 provided at both ends of base portion 11 to other members, respectively. Thus, the "region through which bending is transmitted into the projecting portion via the first constricted portion when the base portion is bent" is limited to only region 8 which is visible when projecting portion 12 is viewed from first constricted portion 21 in a direction of an arrow 92 perpendicular or substantially perpendicular to a longitudinal direction 91 of base portion 11. In projecting portion 12, components 3 are disposed in a portion except for region 8. FIG. 8 shows an example of a state in which base portion 11 has been bent in flexible substrate 201 in order to connect external connection conductors 4 to other members.

Although region 8 is defined as extending in the direction perpendicular or substantially perpendicular to longitudinal direction 91 of base portion 11 in the example shown in FIGS. 7 and 8, region 8 will extend in a different direction if the bending is done differently.

In this preferred embodiment, even when base portion is bent, bending transmitted to first wide portion 31 is limited to a small amount of bending transmitted via first constricted portion 21. Since components 3 are disposed in a portion except for region 8 through which the bending of base portion 11 is transmitted in projecting portion 12, the bending is hardly transmitted to components 3, thus avoiding the occurrence of high bending stress in components 3 and at electrical connections to components 3. Thus, degradation of reliability of electrical connection due to the bending of flexible substrate 201 to mount of the substrate to another member is significantly reduced or prevented.

Although substrate 1 preferably includes only one projecting portion 12, for example, with all of components 3 being disposed together in this one projecting portion 12 in the example shown in FIGS. 7 and 8, this is merely an example. Substrate 1 may include a plurality of projecting portions 12.

Figure 9:
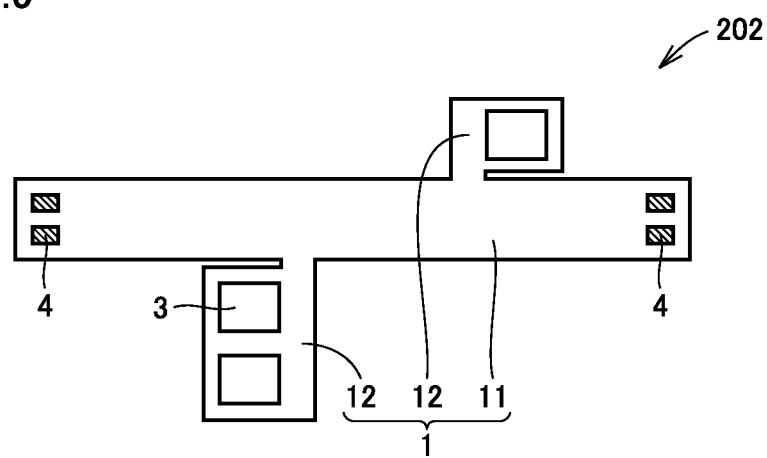
FIG. 9 is a plan view of a first variation of the flexible substrate according to the second preferred embodiment of the present invention.

A variation of this preferred embodiment may be, for example, a flexible substrate 202 such as shown in FIG. 9. Flexible substrate 202 is provided with a plurality of projecting portions 12, with components 3 being dispersed over the plurality of projecting portions 12. By using this configuration, the length of lateral projection from base portion 11 is able to be reduced, thus reducing the overall width of flexible substrate 202.

Figure 10:
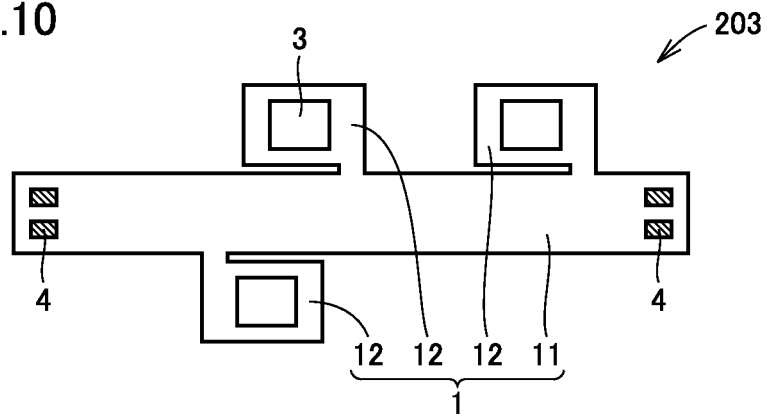
FIG. 10 is a plan view of a second variation of the flexible substrate according to the second preferred embodiment of the present invention.
Figure 11:
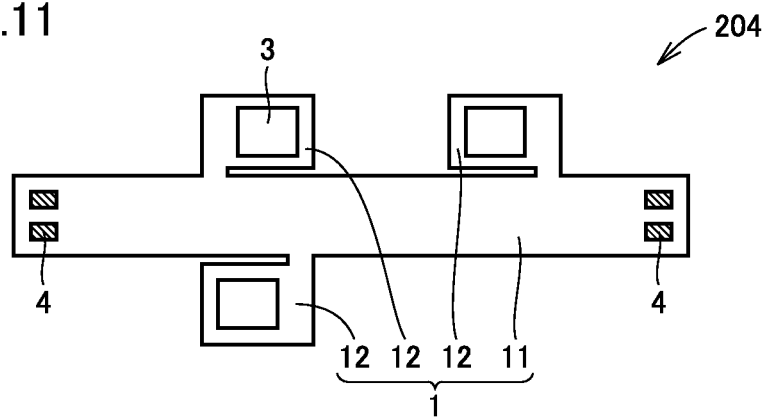
FIG. 11 is a plan view of a third variation of the flexible substrate according to the second preferred embodiment of the present invention.

A further variation of this preferred embodiment may be a flexible substrate 203 such as shown in FIG. 10, or a flexible substrate 204 such as shown in FIG. 11. In flexible substrates 203 and 204, one projecting portion 12 is provided for each component. By using this configuration, the length of lateral projection from base portion 11 is further reduced, thus reducing the overall width of flexible substrates 203 and 204. In flexible substrate 204 shown in FIG. 11, one projecting portion 12 and another projecting portion 12 preferably are arranged symmetrically with base portion 11 interposed between them, for example. However, since the cutouts defining the constricted portions are made from opposite sides to each other, the positions of components 3 are not symmetrical to each other.

Figure 12:
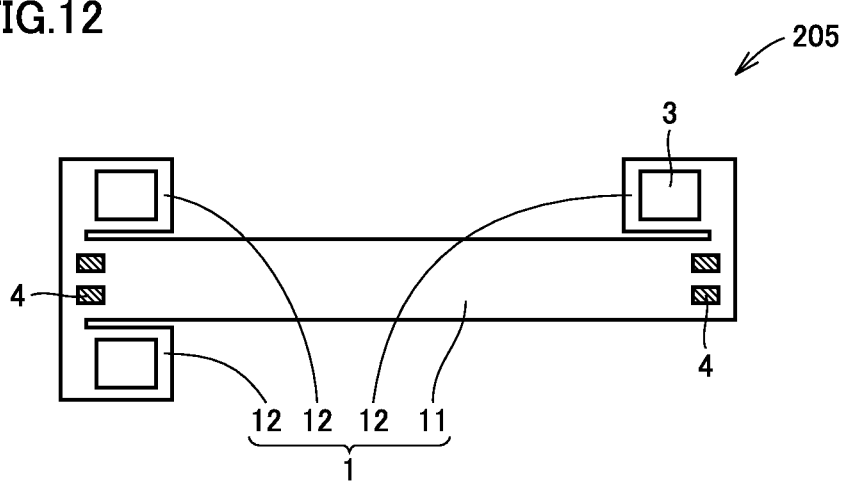
FIG. 12 is a plan view of a fourth variation of the flexible substrate according to the second preferred embodiment of the present invention.

A further variation of this preferred embodiment may be a flexible substrate 205 such as shown in FIG. 12. Projecting portions 12 do not necessarily project laterally from a middle portion of base portion 11, but may project laterally from an end portion of base portion 11, as with projecting portions 12 of flexible substrate 205.

Figure 13:
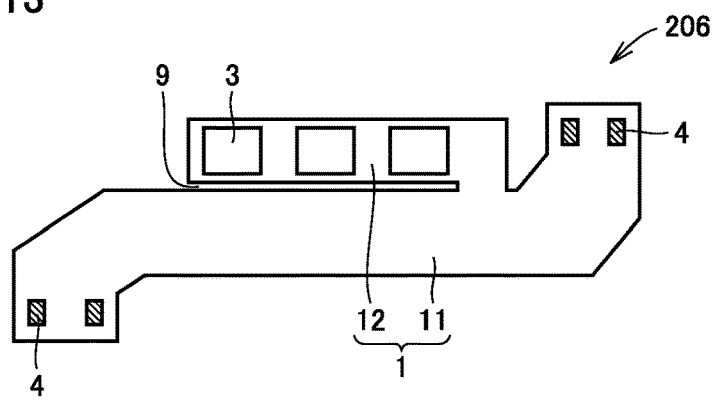
FIG. 13 is a plan view of a fifth variation of the flexible substrate according to the second preferred embodiment of the present invention.

Although this preferred embodiment has been described by referring to base portion 11 having a strip shape by way of example, base portion 11 does not necessarily have a strip shape but may have any shape as long as being bendable depending on the intended purpose of use. Thus, a further variation of this preferred embodiment may be a flexible substrate 206 such as shown in FIG. 13. In flexible substrate 206, base portion 11 has a shape including bent portions. In flexible substrate 206, projecting portion 12 has a longitudinal shape extending parallel or substantially parallel to the longitudinal direction of base portion 11. In projecting portion 12 of flexible substrate 206, a constricted portion is provided by forming cutout 9 from one side in the direction parallel or substantially parallel to the longitudinal direction of projecting portion 12.

Third Preferred Embodiment

Although the first and second preferred embodiments show examples where the constricted portion of the projecting portion preferably is defined by a cutout(s) made from one side or both sides, the constricted portion is not necessarily defined by a cutout(s). The constricted portion may be defined by providing some type of a notch, for example.

Figure 14:
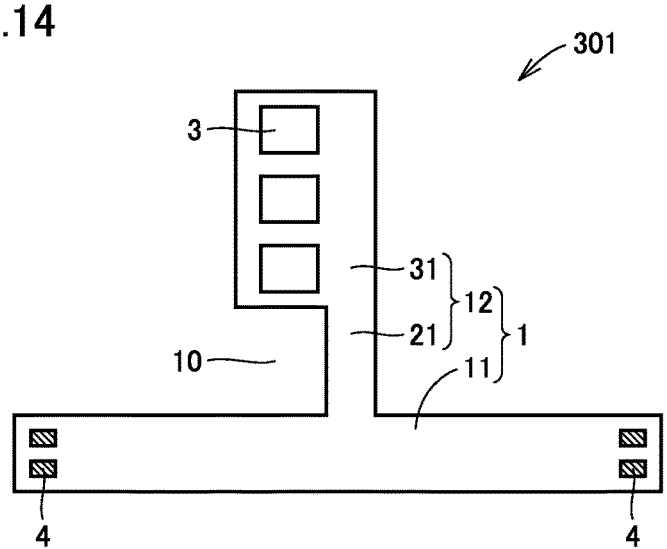
FIG. 14 is a plan view of a flexible substrate according to a third preferred embodiment of the present invention.

Referring to FIG. 14, a flexible substrate according to a third preferred embodiment of the present invention is described. In a flexible substrate 301 shown in FIG. 14, first constricted portion 21 preferably is formed by providing a notch portion 10 having a notched shape.

Figure 15:
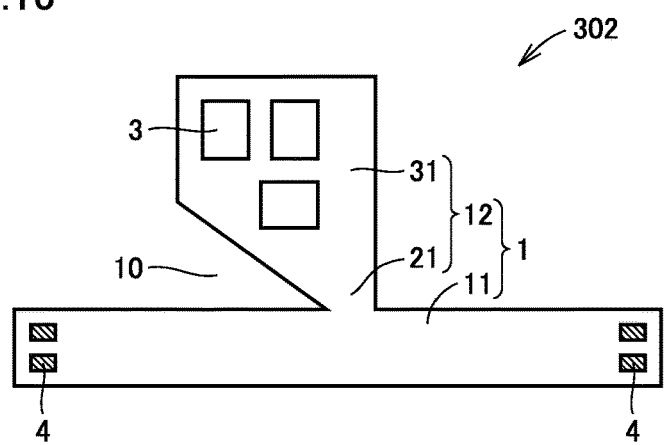
FIG. 15 is a plan view of a variation of the flexible substrate according to the third preferred embodiment of the present invention.

In addition, notch portion 10 does not necessarily have a rectangular or substantially rectangular shape but may have another shape. In a flexible substrate 302 shown in FIG. 15, first constricted portion 21 preferably is defined by providing a triangular notch portion 10, for example.

Fourth Preferred Embodiment

Although the first to third preferred embodiments show examples where the projecting portion extends perpendicular or substantially perpendicular to the longitudinal direction of the base portion, the direction in which the projecting portion extends is not necessarily perpendicular or substantially perpendicular to the longitudinal direction of the base portion. The projecting portion may extend in any direction relative to the longitudinal direction of the base portion. The base portion does not necessarily have a longitudinal direction in the first place. The base portion itself may also have any shape.

Figure 16:
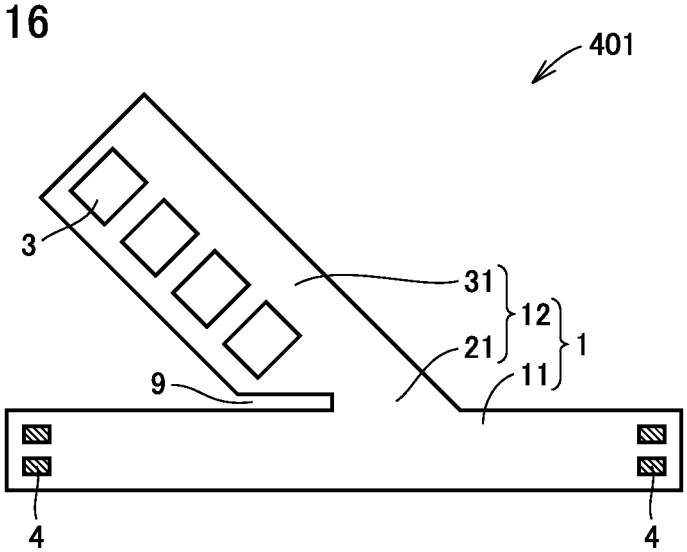
FIG. 16 is a plan view of a flexible substrate according to a fourth preferred embodiment of the present invention.

Referring to FIG. 16, a flexible substrate according to a fourth preferred embodiment of the present invention is described. In a flexible substrate 401 shown in FIG. 16, projecting portion 12 extends in a direction oblique to base portion 11 which has a horizontal direction in the figure as a longitudinal direction.

Figure 17:
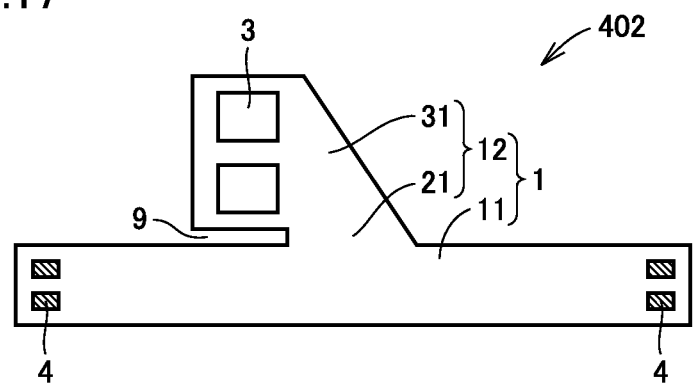
FIG. 17 is a plan view of a variation of the flexible substrate according to the fourth preferred embodiment of the present invention.

A flexible substrate 402 such as shown in FIG. 17 may be used.

Fifth Preferred Embodiment

Figure 18:
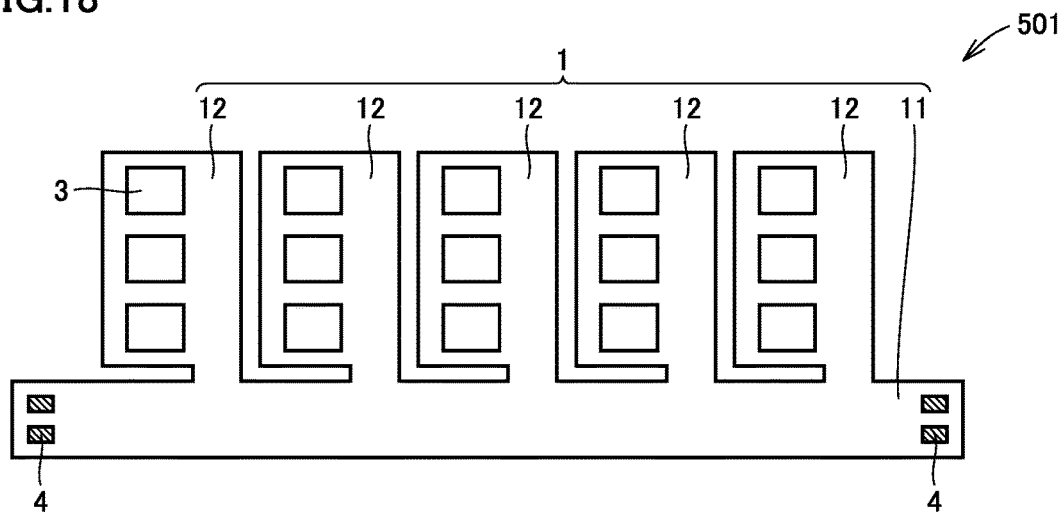
FIG. 18 is a plan view of a flexible substrate according to a fifth preferred embodiment of the present invention.

Referring to FIG. 18, a flexible substrate according to a fifth preferred embodiment of the present invention is described. In a flexible substrate 501 shown in FIG. 18, a plurality of projecting portions 12 are aligned with one another along the longitudinal direction of base portion 11. Projecting portions 12 each extend in the direction perpendicular or substantially perpendicular to the longitudinal direction of base portion 11.

By using this configuration, a large number of components 3 are able to be mounted. Although flexible substrate 501 shown in FIG. 18 is provided with projecting portions 12 only on one side thereof, this is merely an example, and projecting portions 12 may be provided on both sides of base portion 11.

Sixth Preferred Embodiment

Figure 19:
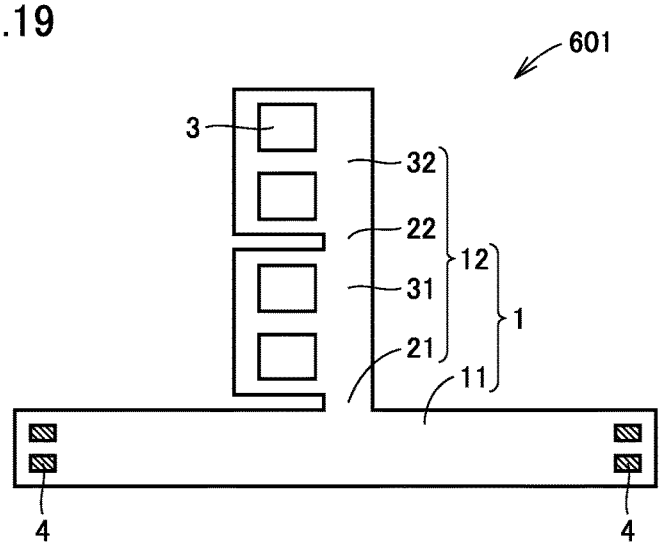
FIG. 19 is a plan view of a flexible substrate according to a sixth preferred embodiment of the present invention.

Referring to FIG. 19, a flexible substrate according to a sixth preferred embodiment of the present invention is described. FIG. 19 shows a plan view of the flexible substrate in this preferred embodiment.

A flexible substrate 601 in this preferred embodiment includes substrate 1 including interconnection wiring on the surface of or in substrate 1, components 3 disposed on the surface of or in substrate 1 and electrically connected to the interconnection wiring, and external connection conductors 4 provided on the surface of substrate 1. Substrate 1 includes, when viewed two-dimensionally, base portion 11 where external connection conductors 4 are disposed, and projecting portion 12 projecting from base portion 11. Projecting portion 12 includes first constricted portion 21 provided at the connection to base portion 11, and first wide portion 31 provided on an extension of first constricted portion 21 and having a width greater than that of first constricted portion 21. Components 3 are disposed in first wide portion 31.

In this preferred embodiment, more preferably, projecting portion 12 includes a second constricted portion 22 on an extension of first wide portion 31, and a second wide portion 32 on an extension of second constricted portion 22, with components 3 being disposed also in second wide portion 32.

In this preferred embodiment, since the projecting portion further includes the second wide portion on an extension of the first wide portion, more components are able to be disposed in the projecting portion.

Seventh Preferred Embodiment

Figure 20:
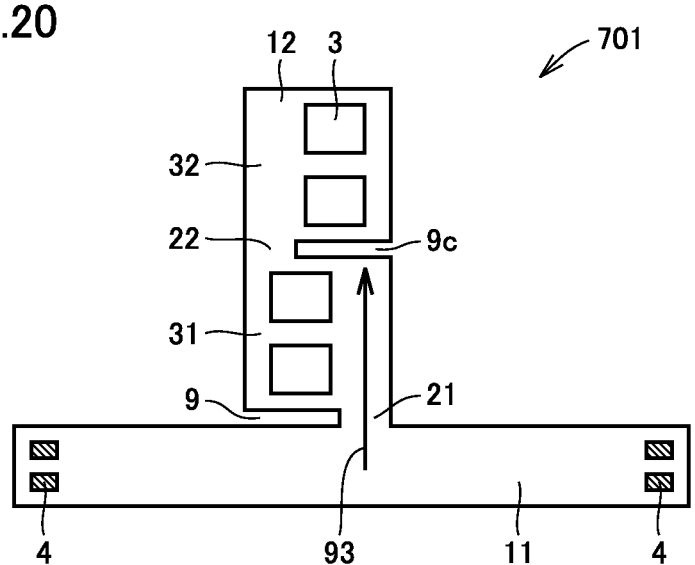
FIG. 20 is a plan view of a flexible substrate according to a seventh preferred embodiment of the present invention.

Referring to FIG. 20, a flexible substrate according to a seventh preferred embodiment of the present invention is described. FIG. 20 shows a plan view of the flexible substrate in this preferred embodiment. A flexible substrate 701 in this preferred embodiment has a basic configuration that preferably is the same or substantially the same as that of flexible substrate 601 described in the sixth preferred embodiment, but is different in the following point.

In flexible substrate 701, in a view from base portion toward first constricted portion 21, second constricted portion 22 is in a position not overlapping with first constricted portion 21.

In this preferred embodiment, the effect described in the first or second preferred embodiment is obtained, that is, the bending is hardly transmitted to components 3 disposed in first wide portion 31, thus avoiding the occurrence of high bending stress in components 3 in first wide portion 31 and at electrical connections to components 3.

Furthermore, in this preferred embodiment, since second constricted portion 22 is in a position not overlapping with first constricted portion 21, bending is transmitted from base portion 11 to projecting portion 12 as indicated with an arrow 93, for example, when base portion 11 is bent, but is blocked by a cutout 9c and is not transmitted beyond cutout 9c.

Accordingly, the transmission of bending to second wide portion 32 is more reliably blocked, thus more reliably preventing the transmission of bending to components 3 disposed in second wide portion 32. Therefore, the occurrence of high bending stress in components 3 in second wide portion 32 and at the electrical connections to components 3 is avoided. Thus, the degradation of reliability of electrical connection due to the bending of flexible substrate 701 to mount of the substrate to another member is significantly reduced or prevented.

Figure 21:
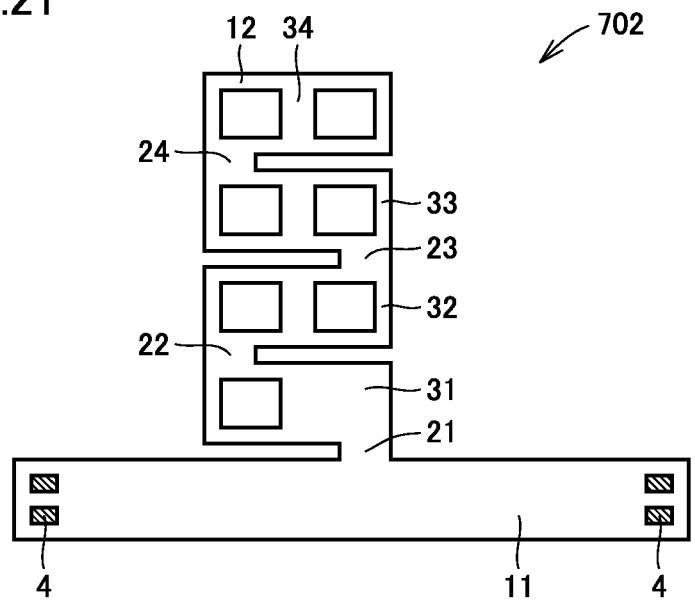
FIG. 21 is a plan view of a variation of the flexible substrate according to the seventh preferred embodiment of the present invention.

For example, FIG. 21 shows a flexible substrate 702 as a further developed form. Flexible substrate 702 includes a third constricted portion 23 on an extension of second wide portion 32, a third wide portion 33 on an extension of third constricted portion 23, a fourth constricted portion 24 on an extension of third wide portion 33, and a fourth wide portion 34 on an extension of fourth constricted portion 24. In this way, projecting portion 12 is able to be extended by alternately disposing the constricted portion and the wide portion.

Figure 22:
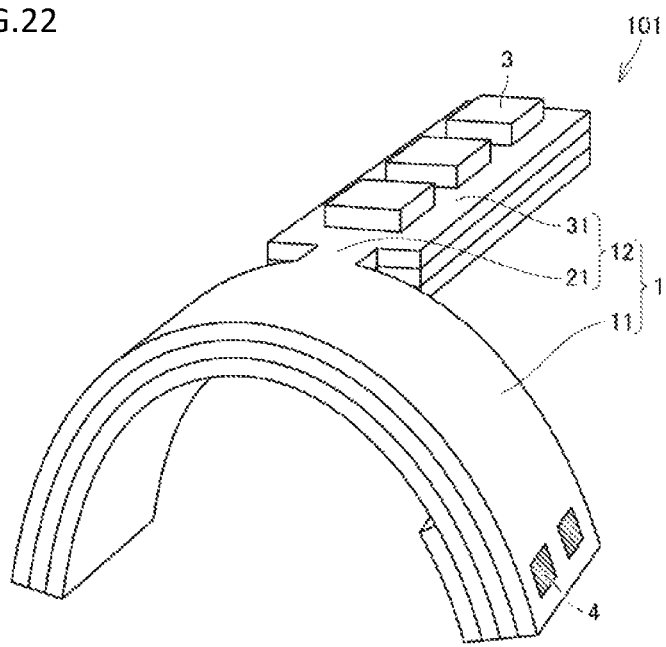
FIG. 22 is a perspective view of a state in which the flexible substrate according to a preferred embodiment of the present invention has been bent and the base portion includes different thickness portions.
Figure 23:
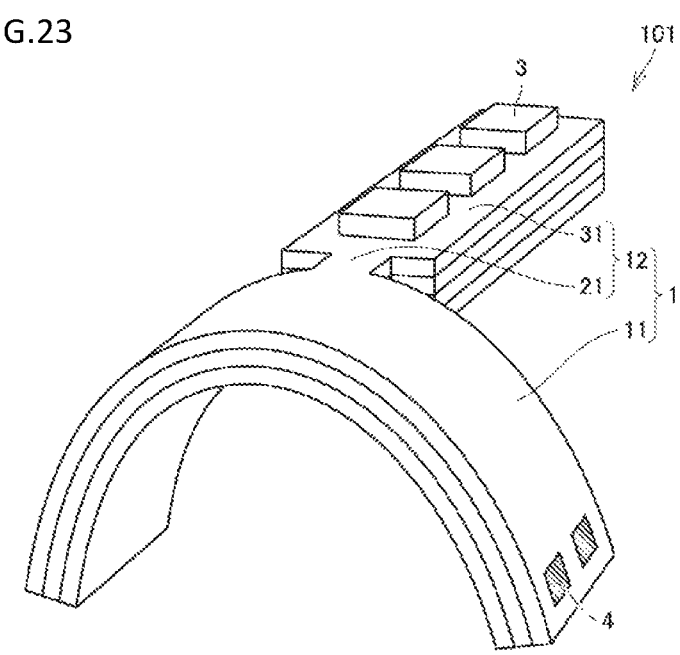
FIG. 23 is a perspective view of a state in which the flexible substrate according to a preferred embodiment of the present invention has been bent and the base portion and the projecting portion have different thicknesses.
Figure 24:
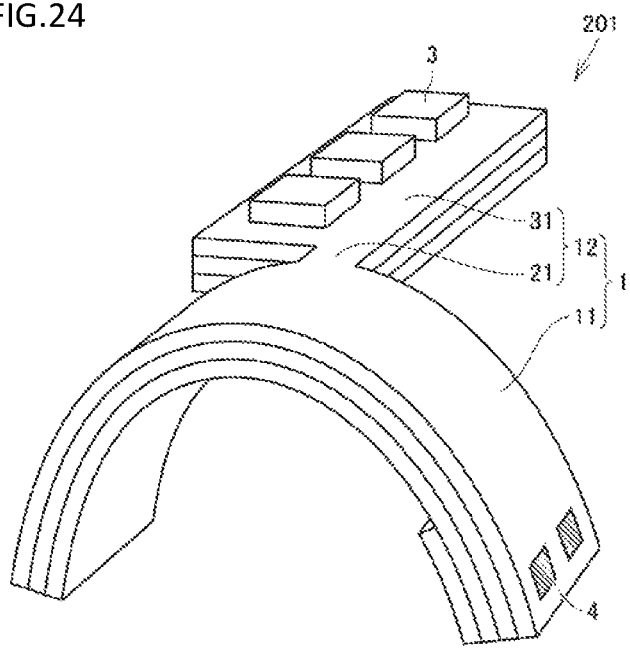
FIG. 24 is a perspective view of a state in which the flexible substrate according to a preferred embodiment of the present invention has been bent and the base portion includes different thickness portions.
Figure 25:
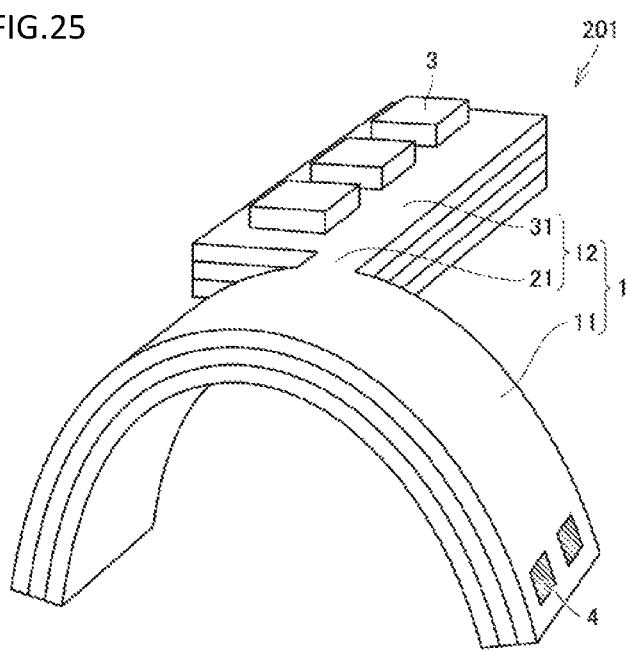
FIG. 25 is a perspective view of a state in which the flexible substrate according to a preferred embodiment of the present invention has been bent and the base portion and the projecting portion have different thicknesses.

Although the above preferred embodiments have been described based on the assumption that the flexible substrate is constant in thickness in all portions, the flexible substrate according to various preferred embodiments of the present invention is not necessarily constant in thickness in all portions, but may vary in thickness depending on the portions. For example, the base portion may include portions having different thicknesses as shown in FIGS. 22 and 24, or the base portion and the projecting portion may have different thicknesses as shown in FIGS. 23 and 25.

Although the above preferred embodiments have been illustrated and described based on the assumption that all of the components included in the flexible substrate have the same outer shape, the components included in the flexible substrate do not necessarily have the same outer shape. Components having different shapes, sizes, and types may be present as appropriate.

It is noted that the preferred embodiments disclosed herein are illustrative and non-restrictive in every respect. The scope of the present invention is defined by the terms of the claims, rather than the description above, and is intended to include any modifications within the scope and meaning equivalent to the terms of the claims.

Preferred embodiments of the present invention are configured or able to be utilized for a flexible substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible substrate comprising:
    a substrate including interconnection wiring on a surface of or in the substrate;
    a component disposed on the surface of or in the substrate and electrically connected to the interconnection wiring; and an external connection conductor provided on the surface of the substrate; wherein the substrate includes, when viewed two-dimensionally, a base portion where the external connection conductor is disposed, and a projecting portion projecting from the base portion;

the projecting portion includes a first constricted portion provided at a connection to the base portion, and a first wide portion provided on an extension of the first constricted portion and having a width greater than that of the first constricted portion, with the component being disposed in the first wide portion;

the first constricted portion is defined by a notch portion;

the base portion being configured such that bending is transmitted to the first constricted portion; and the component is disposed on a top side of the first wide portion which is not visible when the projection portion is viewed from the base portion via the first constricted portion in the condition of the base portion being bent.

2. The flexible substrate according to claim 1, wherein the projecting portion includes a second constricted portion on an extension of the first wide portion, and a second wide portion on an extension of the second constricted portion, and a second component is disposed in the second wide portion.

3. The flexible substrate according to claim 1, wherein the substrate is a single-layer substrate.

4. The flexible substrate according to claim 1, wherein the substrate is a multi-layer substrate.

5. The flexible substrate according to claim 1, wherein the constricted portion is defined by cutouts defined in left and right sides at a bottom of the projecting portion.

6. The flexible substrate according to claim 1, wherein the substrate includes a plurality of the projection portions.

7. The flexible substrate according to claim 1, wherein components are disposed in a portion except for a region through which bending is transmitted into the projecting portion via the first constricted portion when the base portion is bent.

8. The flexible substrate according to claim 1, wherein the notch portion is one of rectangular, substantially rectangular, triangular and substantially triangular.

9. The flexible substrate according to claim 1, wherein the projecting portion extends perpendicular or substantially perpendicular to a longitudinal direction of the base portion.

10. The flexible substrate according to claim 1, wherein the projecting portion extends obliquely to a longitudinal direction of the base portion.

11. The flexible substrate according to claim 1, wherein a plurality of components are aligned with one another along a longitudinal direction of the base portion.

12. The flexible substrate according to claim 1, wherein the base portion includes different thickness portions.

13. The flexible substrate according to claim 1, wherein the base portion and the projecting portion have different thicknesses.

14. The flexible substrate according to claim 2, wherein in a view from the base portion toward the first constricted portion, the second constricted portion does not overlap with the first constricted portion.

15. The flexible substrate according to claim 2, wherein the projecting portion includes a third constricted portion on an extension of the second wide portion, and a third wide portion on an extension of the third constricted portion.

16. The flexible substrate according to claim 6, wherein components are arranged over the plurality of projecting portions.

17. The flexible substrate according to claim 6, wherein the plurality of projecting portions are located on an upper side and a lower side relative to the base portion.

18. The flexible substrate according to claim 6, wherein components are provided such that one of the plurality of projecting portions is provided for each of the components.

19. The flexible substrate according to claim 15, wherein the projecting portion includes a fourth constricted portion on an extension of the third wide portion, and a fourth wide portion on an extension of the fourth constricted portion.

* * * * *